(12) United States Patent
Sakai

(10) Patent No.: US 7,498,722 B2
(45) Date of Patent: Mar. 3, 2009

(54) PIEZOELECTRIC DEVICE

(75) Inventor: Masayuki Sakai, Kouza-gun (JP)

(73) Assignee: Epson Toyocom Corporation, Tokyo (JP)

( * ) Notice: Subject to any disclaimer, the term of this patent is extended or adjusted under 35 U.S.C. 154(b) by 0 days.

(21) Appl. No.: 11/785,218

(22) Filed: Apr. 16, 2007

(65) Prior Publication Data

US 2007/0252482 A1 Nov. 1, 2007

(30) Foreign Application Priority Data

Apr. 27, 2006 (JP) ............................. 2006-123022

(51) Int. Cl.
*H01L 41/053* (2006.01)
(52) U.S. Cl. ...................................... 310/340
(58) Field of Classification Search ................ 310/340, 310/344, 348
See application file for complete search history.

(56) References Cited

U.S. PATENT DOCUMENTS

| | | | | |
|---|---|---|---|---|
| 5,818,145 A | * | 10/1998 | Fukiharu | 310/313 R |
| 6,456,168 B1 | * | 9/2002 | Luff | 331/68 |
| 7,256,658 B2 | * | 8/2007 | Asamura | 331/68 |
| 7,339,309 B2 | * | 3/2008 | Okazaki et al. | 310/348 |
| 2005/0269911 A1 | * | 12/2005 | Usuda | 310/348 |
| 2007/0126316 A1 | * | 6/2007 | Usuda et al. | 310/348 |
| 2007/0176517 A1 | * | 8/2007 | Moriya et al. | 310/348 |
| 2007/0247029 A1 | * | 10/2007 | Maruyama | 310/348 |

FOREIGN PATENT DOCUMENTS

JP A 2005-117188 4/2005

* cited by examiner

*Primary Examiner*—Thomas M Dougherty
(74) *Attorney, Agent, or Firm*—Oliff & Berridge, PLC

(57) ABSTRACT

A piezoelectric device includes a piezoelectric element package having a piezoelectric element accommodated therein and a connection terminal formed on a side surface and a bottom surface thereof, a circuit element coupled to the connection terminal on the bottom surface of the piezoelectric element package, an insulating resin portion being in an essentially rectangular parallelepiped shape and covering the circuit element, an external electrode formed on a bottom surface of the resin portion, and a connection electrode formed on the side surface of the piezoelectric element package and a side surface of the resin portion and coupling the connection terminal formed on the side surface of the piezoelectric element package and the external electrode on the resin portion.

3 Claims, 2 Drawing Sheets

PIEZOELECTRIC DEVICE

BACKGROUND

1. Technical Field

The present invention relates to a surface-mount type piezoelectric device used in communication equipment and an electronic apparatus.

2. Related Art

In recent years, downsizing of apparatuses has been rapidly progressed due to demand of improving portability of electronic apparatuses and communication equipment. Therefore, a piezoelectric device as typified by a crystal oscillator used for those apparatuses is required to be reduced in size and height.

As a piezoelectric device reduced in size and height, a crystal oscillator with a structure shown in JP-A-2005-117188 (refer to FIGS. 1, 6, and 7) has been known. This crystal oscillator will be described with reference to FIGS. 3A and 3B. FIG. 3A is a schematic sectional view of the crystal oscillator, and FIG. 3B is a bottom view of the crystal oscillator.

A crystal oscillator 50 has a crystal resonator package 60 having a crystal resonator element 61 therein. On a bottom surface of the crystal resonator package 60, an IC component 62 including an IC chip is mounted and a connection terminal 64 of the crystal resonator package 60 is coupled with a terminal 63 of the IC component 62. Further, as shown in FIG. 3B, an electrode 66 made of a conductive adhesive is formed to be extended to reach a bottom surface of the IC component 62 from the connection terminal 64 located outward from an outer frame of the IC component 62 through a side surface of the IC component 62. Accordingly, conductivity between the connection terminal 64 formed on the bottom surface of the crystal resonator package 60 and the bottom surface of the IC component 62 is ensured. The electrode on the bottom surface of the IC component 62 is used as an external electrode for an external connection with a circuit substrate or the like.

However, in the structure of the crystal oscillator 50 in related art mentioned above, when the crystal oscillator 50 is reduced in size and the size of the IC component 62 is relatively large compared to that of the crystal resonator package 60, it is conceivable that an area for the connection terminal 64 on the bottom surface of the crystal resonator package 60 and located outward from the outer frame of the IC component 62 becomes small, making a connection with the connection terminal 64 by a conductive adhesive difficult.

Further, since the electrode 66 is made of a conductive adhesive, running off of the conductive adhesive from the outer frame of the crystal oscillator 50 and difficulty in forming a shape of an external electrode with high accuracy are considered as issues.

SUMMARY

An advantage of the invention is to provide a piezoelectric device having a connection between a connection terminal and an external electrode ensured without any difficulty and having the external electrode accurately structured even when the piezoelectric device is reduced in size and thus the size of an IC component such as an IC chip becomes relatively large compared to the size of a piezoelectric element package.

A piezoelectric device according to an aspect of the invention includes a piezoelectric element package having a piezoelectric element accommodated therein and a connection terminal formed on a side surface and a bottom surface thereof, a circuit element coupled to the connection terminal on the bottom surface of the piezoelectric element package, an insulating resin portion being in an essentially rectangular parallelepiped shape and covering the circuit element, an external electrode formed on a bottom surface of the resin portion, and a connection electrode formed on the side surface of the piezoelectric element package and a side surface of the resin portion and coupling the connection terminal formed on the side surface of the piezoelectric element package and the external electrode on the resin portion.

According to this structure, the connection terminal is formed on the side surface of the piezoelectric element package and coupled with the external electrode formed on the bottom surface of the resin portion through the connection electrode formed on the side surface of the piezoelectric element package and the side surface of the resin portion. Therefore, even when the piezoelectric device is reduced in size and the size of the circuit element such as an IC chip becomes relatively large compared to that of the piezoelectric element package, a connection between the connection terminal and the external electrode is ensured without any difficulty. A piezoelectric device reduced in size and height with a simple structure can be thus provided.

In the piezoelectric device according to the aspect of the invention, the connection electrode and the external electrode are preferably formed with an electrode made of conductive ink deposited on from the side surface of the piezoelectric element package to the bottom surface of the resin portion.

By using conductive ink, the connection electrode and the external electrode can be respectively formed to be a precise shape in an exact position with an inkjet method, thereby providing the piezoelectric device having the connection electrode and the external electrode each formed in an accurate shape and coupled with the connection terminal on the side surface of the piezoelectric element package.

In the piezoelectric device according to the aspect of the invention, the connection electrode and the external electrode are preferably formed with an electrode made of a conductive paste deposited on from the side surface of the piezoelectric element package to the bottom surface of the resin portion.

By using the conductive paste, the connection electrode and the external electrode can be respectively formed to be a precise shape in an exact position with a printing method or the like, thereby providing the piezoelectric device having the connection electrode and the external electrode each formed in an accurate shape and coupled with the connection terminal on the side surface of the piezoelectric element package.

BRIEF DESCRIPTION OF THE DRAWINGS

The invention will be described with reference to the accompanying drawings, wherein like numbers reference like elements.

FIG. 1A is a schematic plan view, while FIG. 1B is a schematic sectional view and FIG. 1C is a schematic bottom view.

FIG. 3A is a schematic sectional view while FIG. 3B is a schematic bottom view.

DESCRIPTION OF EXEMPLARY EMBODIMENTS

An embodiment of the invention will be described with reference to the accompanying drawings. In the embodiment, a crystal oscillator is described as an example of a piezoelectric device.

EMBODIMENT

Figure 1A:
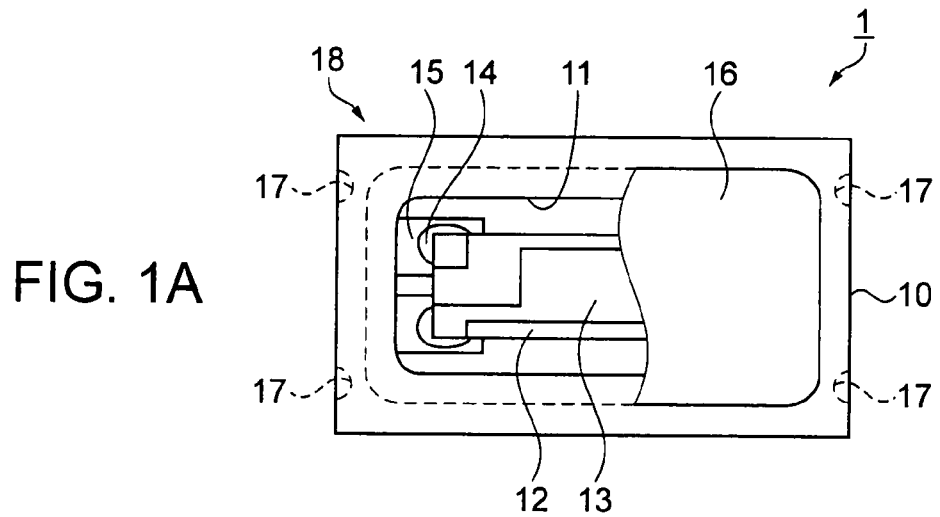
FIGS. 1A through 1C are diagrams showing a structure of a crystal oscillator according to an embodiment.
Figure 1B:
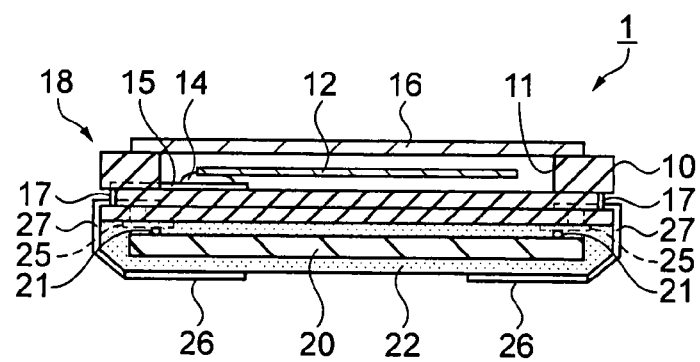
Figure 1C:
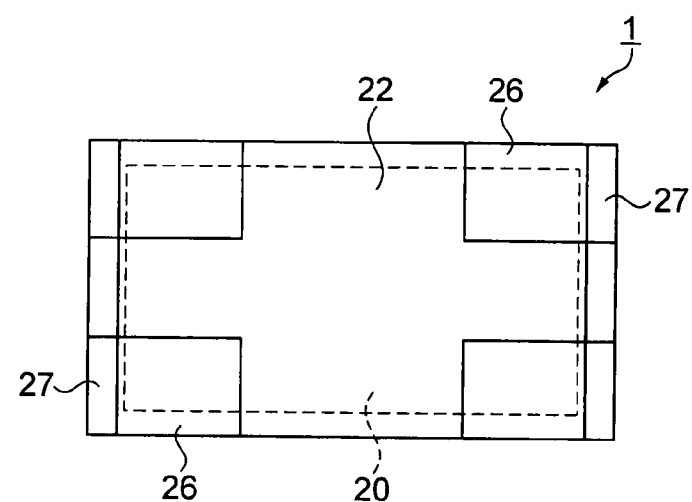
Figure 2:
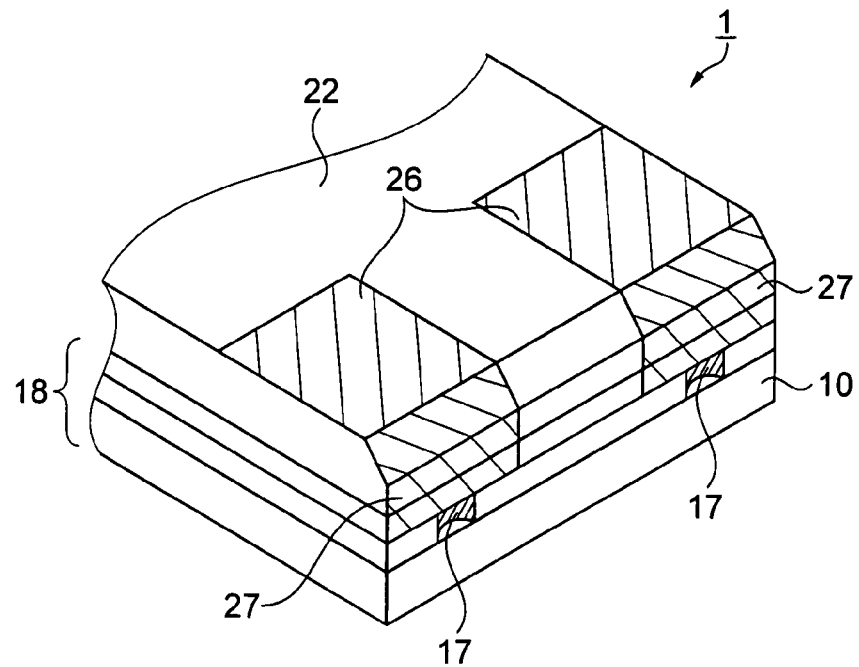
FIG. 2 is a partial perspective view illustrating the crystal oscillator according to the embodiment viewed from its bottom surface.
Figure 3A:
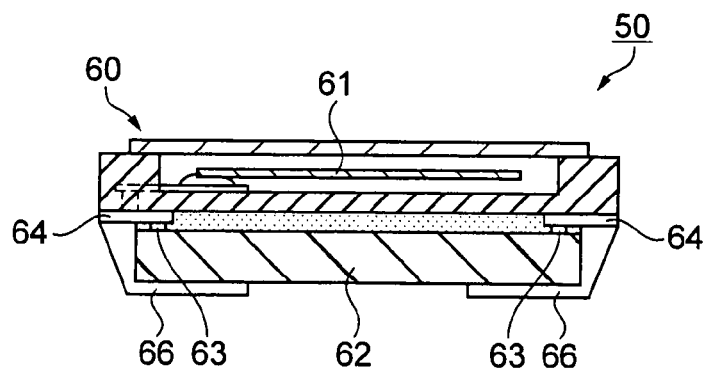
FIGS. 3A and 3B are diagrams showing a structure of a crystal oscillator in related art.
Figure 3B:
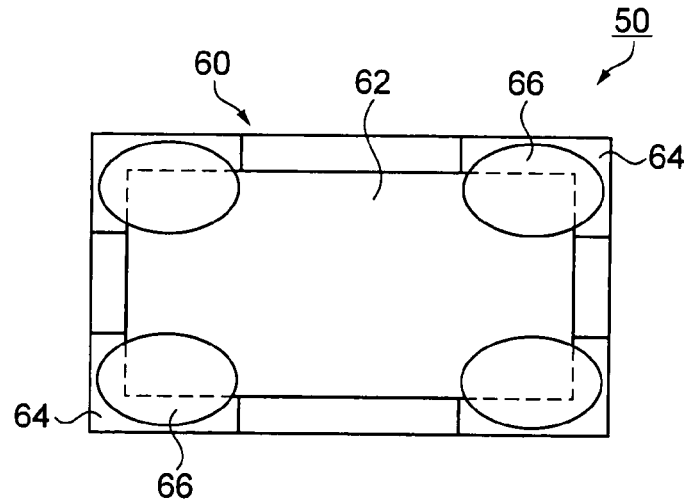

FIGS. 1A through 1C show a structure of the crystal oscillator according to the embodiment. FIG. 1A is a schematic plan view, while FIG. 1B is a schematic sectional view and FIG. 1C is a schematic bottom view. FIG. 2 is a partial perspective view illustrating the crystal oscillator according to the embodiment viewed from its bottom surface.

A crystal oscillator 1 includes a crystal resonator package 18 serving as a piezoelectric element package having a crystal resonator element 12 therein, an IC chip 20 serving as a circuit element mounted on a bottom surface of the crystal resonator package 18, and a resin portion 22 covering the IC chip 20.

The crystal resonator package 18 has the crystal resonator element 12 bonded to a recessed portion 11 formed in a container 10 made of ceramic or the like using a conductive adhesive 14 such as a Ag paste. On the crystal resonator element 12, an excitation electrode 13 is formed and electrically coupled with a connection pad 15 formed on a bottom surface of the recessed portion 11 in the container 10 via the conductive adhesive 14. On a top surface of the container 10, a lid 16 made of metal or the like is arranged and air-tightly seals the recessed portion 11 in the container 10.

Further, on a bottom surface of the container 10, a plurality of connection terminals 25 are formed. A part of the plurality of connection terminals 25 is coupled with the connection pad 15 formed on the recessed portion 11. Furthermore, on a side surface of the container 10, a connection terminal 17 is formed. A part of the connection terminal 17 is coupled with the connection pad 15 formed on the recessed portion 11 while another part of the connection terminal 17 is coupled with the connection terminals 25.

The connection terminals 25 formed on the bottom surface of the container 10 have the IC chip 20 having a bump 21 made of Au or the like being mounted face-down. The IC chip 20 is provided with an oscillation circuit that excites the crystal resonator element 12, and in some cases, also includes a temperature compensation circuit and a memory circuit, for example.

Then, the resin portion 22 made of an insulation material such as epoxy resin and being in an essentially rectangular parallelepiped shape is formed on the bottom surface of the crystal resonator package 18 to cover the IC chip 20.

Further, as shown in FIG. 2, a connection electrode 27 is formed on a side surface of the resin portion 22 from the connection terminal 17 on the side surface of the container 10 through the side surface of the container 10. The connection electrode 27 is formed by depositing conductive ink applied with an inkjet method on the container 10 and the resin portion 22.

Further, the conductive ink is applied to from the connection electrode 27 to a bottom surface of the resin portion 22 with an inkjet method or the like, forming an external electrode 26 settled on the resin portion 22.

Accordingly, the connection terminal 17 formed on a side surface of the crystal resonator package 18 is electrically coupled with the external electrode 26 formed on the bottom surface of the resin portion 22 via the connection electrode 27.

As a material for the connection electrode 27 and the external electrode 26, a conductive paste can be applied by a method such as printing and settled on the container 10 and the resin portion 22, forming the connection electrode 27 and the external electrode 26.

Alternatively, a conductive paste can be used to form the external electrode 26 while conductive ink is used to form the connection electrode 27.

Further, in a similar structure, a monitor terminal to evaluate characteristics of the crystal resonator element 12 or an adjustment terminal to write temperature compensation data of the IC chip 20 is formed on the side surface of the crystal resonator package 18, and an electrode is formed to reach from these terminals to the bottom surface of the resin portion 22 (the surface on which the external electrode 26 is formed), enabling characteristic evaluation of the crystal resonator element 12 and temperature compensation data writing into the IC chip 20 from the bottom surface of the crystal oscillator.

As described above, the crystal oscillator 1 has the connection terminal 17 formed on the side surface of the crystal resonator package 18. The connection terminal 17 is coupled with the external electrode 26 formed on the bottom surface of the resin portion 22 through the connection electrode 27 formed on the side surface of the crystal resonator package 18 and the side surface of the resin portion 22. Therefore, even when the crystal oscillator 1 is reduced in size and the size of the IC chip 20 is relatively large compared to that of the crystal resonator package 18, a connection between the connection terminal 17 and the external electrode 26 is ensured without any difficulty. Accordingly, the crystal oscillator reduced in size and height with a simple structure can be provided.

Further, by using conductive ink, the connection electrode 27 and the external electrode 26 can be respectively formed to be a precise shape in an exact position with an inkjet method, thereby providing the crystal oscillator 1 having the connection electrode 27 and the external electrode 26 each formed in an accurate shape and coupled to the connection terminal 17 on the side surface of the crystal resonator package 18.

Alternatively, by using a conductive paste, the connection electrode 27 and the external electrode 26 can be respectively formed to be in a precise shape in an exact position with a printing method, thereby providing the crystal oscillator 1 having the connection electrode 27 and the external electrode 26 each formed in an accurate shape and coupled to the connection terminal 17 on the side surface of the crystal resonator package 18.

In the embodiment as above, the crystal oscillator using a crystal resonator element is described as an example of a piezoelectric device. However, a material for a resonator element is not limited to crystal. A piezoelectric resonator element using a piezoelectric material such as lithium tantalate and lithium niobate can be also possible.

Further, instead of a crystal resonator element, a surface acoustic wave (SAW) resonator and a vibration gyro sensor using a SAW element, a vibration gyro element or the like are also possible to use as a piezoelectric device, and provide same advantageous effect as that of the example in the embodiment.

What is claimed is:

1. A piezoelectric device, comprising:

a piezoelectric element package having a piezoelectric element accommodated therein and a connection terminal formed on a side surface and a bottom surface thereof;

a circuit element coupled to the connection terminal on the bottom surface of the piezoelectric element package;

an insulating resin portion being in an essentially rectangular parallelepiped shape and covering the circuit element;

an external electrode formed on a bottom surface of the resin portion; and a connection electrode formed on the side surface of the piezoelectric element package and a side surface of the resin portion and coupling the connection terminal formed on the side surface of the piezoelectric element package and the external electrode on the resin portion.

2. The piezoelectric device according to claim 1, wherein the connection electrode and the external electrode are formed with an electrode made of conductive ink deposited on from the side surface of the piezoelectric element package to the bottom surface of the resin portion.

3. The piezoelectric device according to claim 1, wherein the connection electrode and the external electrode are formed with an electrode made of a conductive paste settled on from the side surface of the piezoelectric element package to the bottom surface of the resin portion.

* * * * *